United States Patent
Goenka et al.

(10) Patent No.: US 6,271,481 B1
(45) Date of Patent: Aug. 7, 2001

(54) PAD CONFIGURATIONS FOR IMPROVED ETCHING OF MULTILAYER CIRCUIT ASSEMBLIES

(75) Inventors: Lakhi Nandlal Goenka, Ann Arbor; Jay DeAvis Baker, W. Bloomfield, both of MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/146,514

(22) Filed: Sep. 3, 1998

(51) Int. Cl.[7] ........................................... H01R 9/09
(52) U.S. Cl. ...................... 174/261; 174/255; 361/767
(58) Field of Search ................................ 174/261, 260, 174/255; 361/767, 780

(56) References Cited

U.S. PATENT DOCUMENTS

| | | | |
|---|---|---|---|
| 3,801,388 | 4/1974 | Akiyama et al. | 216/20 |
| 4,404,059 | 9/1983 | Livshits et al. | 216/17 |
| 4,888,665 | * 12/1989 | Smith | 361/780 |
| 4,920,639 | * 5/1990 | Yee | 174/261 X |
| 5,264,664 | * 11/1993 | McAllister et al. | 174/261 |
| 5,381,307 | * 1/1995 | Hertz et al. | 361/767 |
| 5,468,917 | * 11/1995 | Brodsky et al. | 174/261 X |
| 5,738,797 | 4/1998 | Belke, Jr. et al. | 216/16 |

* cited by examiner

Primary Examiner—Albert W. Paladini
(74) Attorney, Agent, or Firm—John R. Kajander

(57) ABSTRACT

There is disclosed herein a tri-metal-layer precircuit 50 which may be selectively etched to provide a multilayer electronic circuit 60 having air bridge crossovers 49. The enlarged ends 44 of the upper air bridge elements 42, and/or the top pads 41 of the tower elements 43, are specially designed such that undercutting of the ends 44 and/or top pads 41 is minimized, thereby minimizing the risk of air bridge/top pad delamination.

23 Claims, 3 Drawing Sheets

PAD CONFIGURATIONS FOR IMPROVED ETCHING OF MULTILAYER CIRCUIT ASSEMBLIES

BACKGROUND OF THE INVENTION

1. Field of the Invention

The present invention relates generally to multilayer circuit assemblies, and more particularly to pad shapes for improved etching of tri-metal-layered multilayer circuit assemblies.

2. Disclosure Information

U.S. Pat. No. 3,801,388 to Akiyama et al. (hereinafter "Akiyama"), U.S. Pat. No. 4,404,059 to Livshits et al. (hereinafter "Livshits"), and U.S. Pat. No. 5,738,797 to Belke, Jr. et al. (hereinafter "Belke"), all of which are incorporated herein by reference, disclose various methods for making electronic circuits which feature circuit crossovers or "air bridges" using various combinations of plating, masking, and etching steps. The methods disclosed in these references are useful for making multilayer circuits by selectively etching a tri-metal-layered precircuit such that the desired air bridge and circuit layout structures are created.

For example, the tri-metal precircuit may comprise a structure similar to that illustrated in FIGS. 1–3. Here, the middle layer 10 is a continuous 6-mil-thick aluminum sheet or foil having a top surface 14 and a bottom surface 12, with a first (lower) conductor pattern 20 made of 2-mil-thick copper patterned onto the bottom surface 12, and a second (upper) conductor pattern 40 made of 2-mil-thick copper patterned onto the top surface 14. The lower conductor pattern 20 includes a plurality of base pads 26, pedestal pads 22, and circuit traces 24, while the upper conductor pattern 40 includes a plurality of top pads 41 and bridging elements 42. Each top pad 41 is arranged on the middle layer top surface 14 opposite a respective one of the base pads 26. Each bridging element 42 has first and second enlarged ends 44 and a constricted portion 46 between and contiguous with the enlarged ends. The bridging elements 42 are arranged on the top surface 14 such that each enlarged end 44 is disposed opposite a respective one of the pedestal pads 22 and each constricted portion 46 is disposed opposite and transverse to a respective one of the circuit traces 24.

This precircuit may then be affixed to a substrate 30 having an electrically insulative surface 32 by attaching the first conductor pattern 20 to this surface 32. Then, the precircuit may be exposed for a predetermined amount of time to an etchant (e.g., sodium nitrate) which etches substantially only the aluminum, resulting in the final circuit structure illustrated in FIGS. 4–6. Here, those portions of the aluminum foil 10 which are sandwiched between an enlarged end 44 and a pedestal pad 22, or between a top pad 41 and a base pad 26, are more protected from attack by the etchant than are other portions of the foil 10. After the predetermined amount of time has elapsed and the etching has ceased, most of the foil 10 has been etched away, except for a pedestal 48 of aluminum remaining sandwiched between (1) each matched pair of upper enlarged ends 44 and lower pedestal pads 22, and between (2) each matched pair of upper top pads 41 and lower base pads 26. This provides a plurality of air bridges 42 and a plurality of "towers" 43, as shown in FIGS. 4–6.

The air bridges 42 created by this process serve as three-dimensional crossovers. For example, signal or current may flow from point A to point B along the lower conductor pattern, then rise to point C through an air bridge pedestal, then flow across the air bridge to point D, then down the other pedestal to point E, and then on across the lower conductor pattern to point F, thus allowing the circuit trace path ABCDEF to "cross over" the circuit trace path between points G and H.

Each tower 43 comprises a top pad 41 atop a pedestal 48 atop a base pad 26, as shown in FIG. 6. These towers 43 may be sized and arranged to serve in a variety of interconnect configurations. For example, a given set of towers 43 may serve as wirebond pads, solder joint pads (e.g., for reflowed chip components), direct chip attachment, and the like. A circuit trace 24 is typically attached to the base pad 26 of each tower element 43.

The conductor patterns 20/40 may be formed on the aluminum sheet 10 by various methods disclosed in Belke, Livshits, and Akiyama. These references teach that the enlarged ends 44 and/or top pads 41 should be made a certain minimum size (e.g., 40 mils in diameter or smallest width, for the 2/6/2-mil example above) and the constricted portion 46 made a certain maximum size (e.g., no more than 5 mils wide), so that the foil 10 sandwiched between each pair of enlarged ends 44 and pedestal pads 22 and each pair of top pads 41 and base pads 26 is only partly etched through in the X direction leaving the desired pedestals 48, while all other portions of the foil 10 (including those portions underneath the constricted portions 46) are completely etched away.

Whenever there is ample circuit space available around a given air bridge or tower, one may design the enlarged ends 44 and/or top pads 41 well above the recommended minimum size, thus assuring the formation of sturdy pedestals 48 and a robust metallurgical connection between each pedestal and its upper enlarged end/top pad 44/41. However, in fine-pitch applications, or where circuit layout is particularly crowded, it may not be possible to design the ends/pads 44/41 oversized; in fact, when the size of the ends/pads 44/41 is kept close to the recommended minimum size, or even more so when it is desired to make these features even smaller than recommended, there is often a danger of the ends/pads 44/41 becoming delaminated from their respective pedestals 48 during etching, as illustrated in FIG. 7.

It would be desirable, therefore, to provide a way of keeping the size of the enlarged air bridge ends 44 and top pads 41 small, while minimizing the aforementioned risk of delamination.

SUMMARY OF THE INVENTION

The present invention overcomes the disadvantages of the prior art approaches by providing specially designed multilayer precircuit and final circuit structures which enable the use of smaller air bridge and/or tower structures.

It is an object and advantage that the present invention provides precircuit and final circuit structures which have specially designed enlarged air bridge ends and/or top pads which minimize undercutting of these ends/pads, thereby decreasing their susceptibility to delamination.

Another advantage is that the present invention allows the use of smaller air bridge/tower structures with the same or better integrity and reliability as prior art approaches.

These and other advantages, features and objects of the invention will become apparent from the drawings, detailed description and claims which follow.

DETAILED DESCRIPTION OF THE PREFERRED EMBODIMENTS

Figure 1:
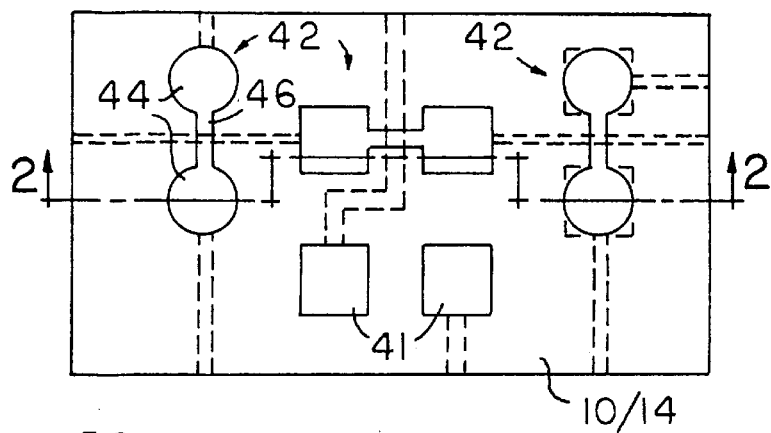
FIGS. 1–3 are top, side sectional, and bottom views, respectively, of a precircuit for use in making a multilayer air bridge circuit according to the prior art.
Figure 2:
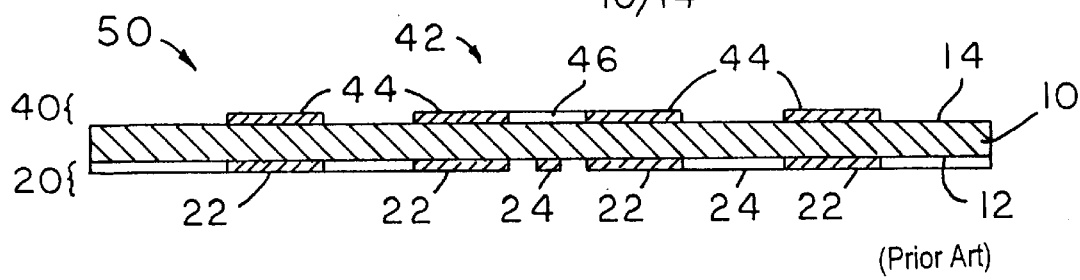
Figure 3:
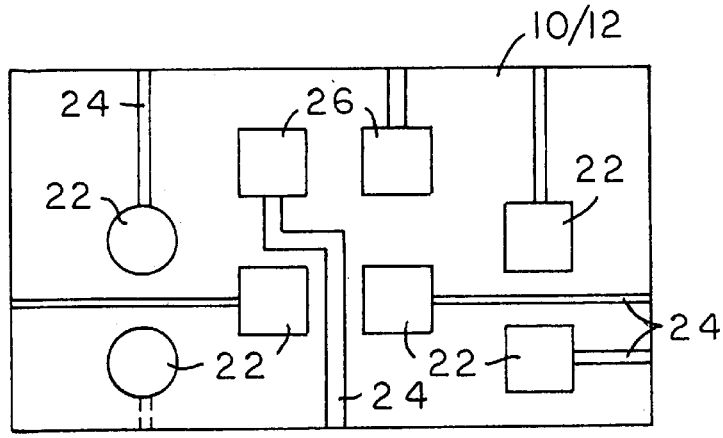
Figure 4:
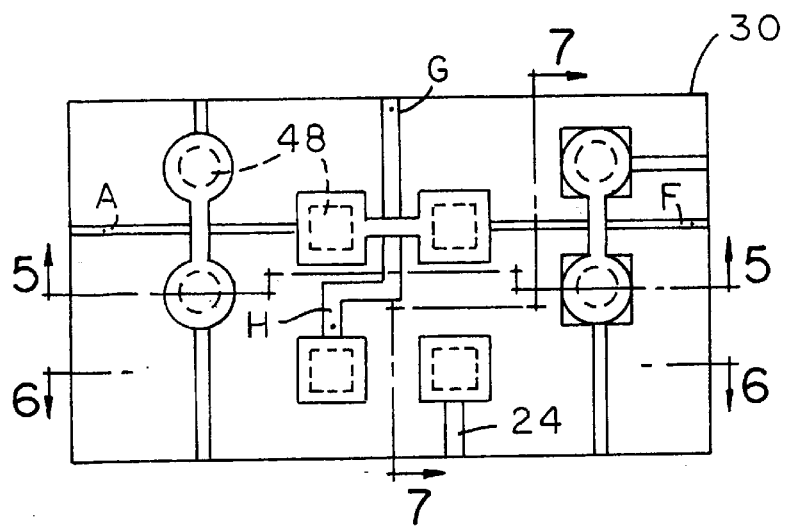
FIGS. 4–6 are top and side sectional views of a final multilayer air bridge circuit after etching of the recircuit shown in FIGS. 1–3, according to the prior art.
Figure 5:
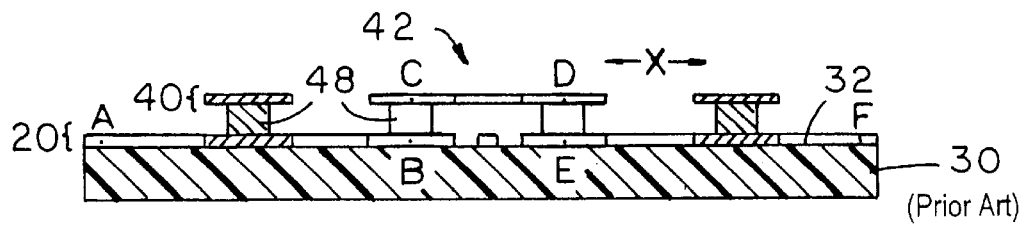
Figure 6:
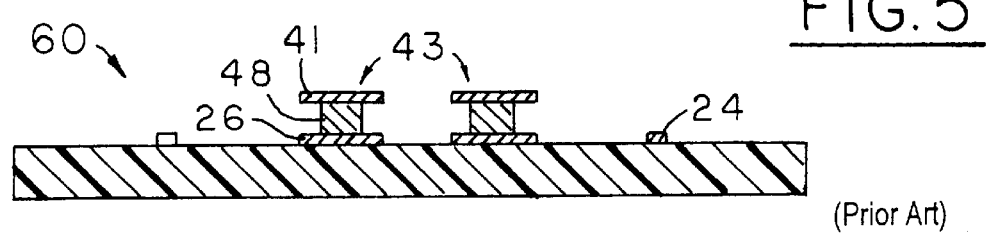
Figure 7:
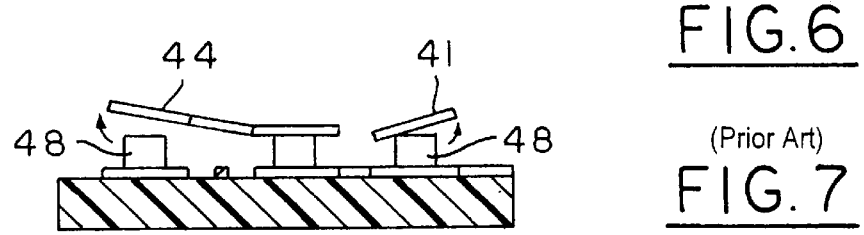
FIG. 7 is an enlarged side view of a multilayer air bridge circuit being etched according the prior art, showing severe undercutting and delamination of an air bridge and a top pad.

Referring now to the drawings, FIGS. 8–13 show three different embodiments of a tri-metal-layer precircuit 50 for use in making a multilayer electronic circuit: 60. A first embodiment of the precircuit 50 comprises: (1) a metallic foil 10 made of a first metal and having a top surface 14 and a bottom surface 12; (2) a first conductor pattern 20 attached to the bottom surface 12 of the metallic foil and made of a second metal, wherein the first conductor pattern comprises a plurality of base pads 26, pedestal pads 22, and circuit traces 24; and (3) a second conductor pattern 40 attached to the top surface 14 of the metallic foil made of a third metal. The second conductor pattern 40 comprises (a) a plurality of top pads 41 each arranged opposite a respective one of the base pads 26, and (b) a plurality of bridging elements 42 having first and second enlarged ends 44 and a constricted portion 46 between and contiguous with the enlarged ends. The bridging elements 42 are arranged on the top surface 14 such that each enlarged end 44 is disposed opposite a respective one of the pedestal pads 22 and each constricted portion 46 is disposed opposite and transverse to a respective one of the circuit traces 24. In the present embodiment, each of the enlarged ends 44 and/or each of the top pads 41 is generally shaped as an n-sided polygon, wherein $n \geq 5$.

Figure 8:
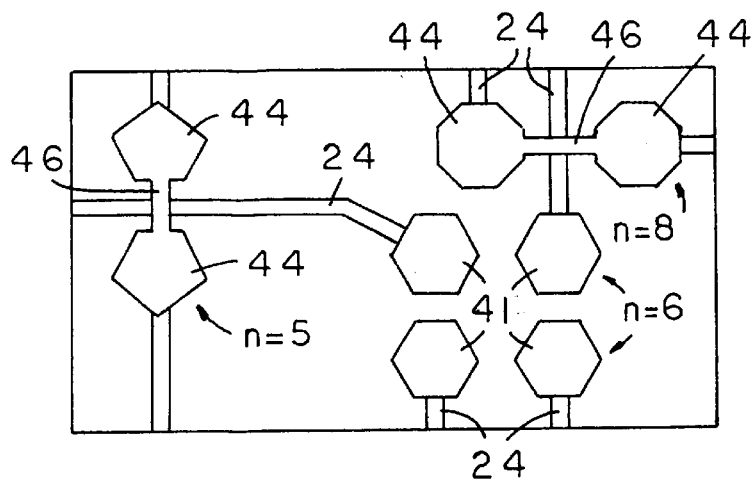
FIG. 8 is a top view of a multilayer air bridge circuit according to a first embodiment of the present invention, wherein each top pad and each enlarged bridge element end is generally shaped as an n-sided polygon, where $n \geq 5$.
Figure 9:
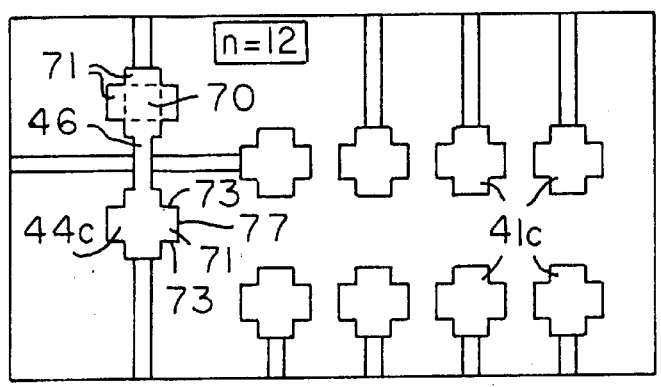
FIGS. 9–11 are top views of multilayer air bridge circuits according to a second embodiment of the present invention, wherein each top pad and each enlarged bridge element end is generally shaped as an n-sided polygon, where $n \geq 6$ and wherein the polygonal shape is generally cross-shaped, asterisk-shaped, star-shaped, or truncated-star-shaped.
Figure 13:
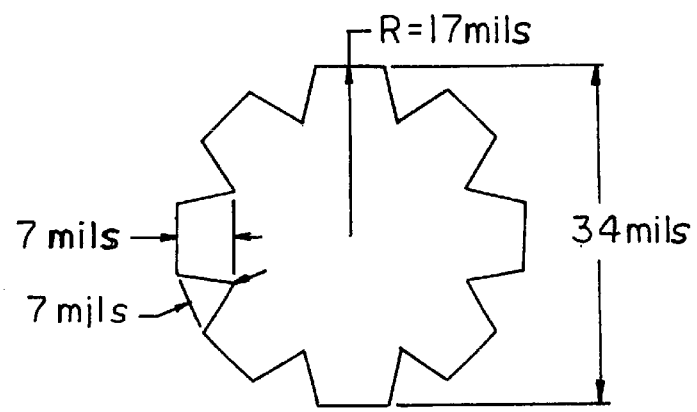
FIG. 13 is a top view of a preferred embodiment of the present invention, wherein a top pad or enlarged bridge element end has an eight-armed truncated-star shape.

To assist the reader in understanding the present invention, all reference numbers used herein are summarized in the table below, along with the elements they represent:

10=Metallic foil [first metal]
12=Bottom surface of metallic foil
14=Top surface of metallic foil
20=First (lower) conductor pattern [second metal]
22=Pedestal pad
24=Circuit trace
26=Base pad
30=Substrate
32=Electrically insulative surface of substrate
40=Second (upper) conductor pattern [third metal]
41=Top pad
42=Bridge element
43=Tower element
44=Enlarged end portion of bridge element
46=Constricted portion between end portions
48=Pedestals of metallic foil [first metal]
49=Air bridge crossover
50=Precircuit
60=Final multilayer air bridge circuit, after etching
70=Center portion of each cross/star/asterisk
71=Arm of cross/star/asterisk configuration
73=Generally radial edges of each arm
75=Point of arm in star configuration
77=Distal/truncated end of each arm
79=Truncated end of each arm in star configuration
a=Subscript denoting asterisk-shaped pad/end portion
c=Subscript denoting cross-shaped pad/end portion
s=Subscript denoting star-shaped pad/end portion
t=Subscript denoting truncated-star pad/end portion
N=Notches formed in pad/end portion
R=Distance from pad/end outer periphery to center The inventors of the present invention have discovered that the rate of undercutting of the metallic foil 10 beneath each enlarged end 44 and/or top pad 41 may be reduced significantly by providing the ends 44 and/or pads 41 with a multi-sided ($n \geq 5$) polygonal shape. The simplest of such shapes would be a pentagon (n=5), then a hexagon (n=6), septagon (n=7), octagon (n=8), and so forth, as illustrated in FIG. 8. However, the inventors have noted even better results in two other configurations: (1) when the polygonal shape is generally cross-shaped 41c/44c ($n \geq 12$), asterisk-shaped 41a/44a ($n \geq 15$), star-shaped 41s/44s ($n \geq 6$), or truncated-star-shaped 41t/44t ($n \geq 9$) as illustrated in FIGS. 9–11 according to a second embodiment of the present invention; and (2) when the shape of each end 44 and/or pad 41 is either generally round or polygonal with notches N formed therein as illustrated in FIG. 13 according to a third embodiment of the present invention.

It is believed that the corners, notches, and arms about the outer periphery of these pad/end configurations provide geometries which disrupt the flow of etchant around these pads/ends 41/44 during etching of the middle layer 10. These flow-disrupting features appear to induce flow separation about the pads/ends; as the etchant "sloshes" about the pads/ends, the separated flow reduces the rate of etching and undercutting on the pedestals 48 beneath these flow-disrupting pads/ends 41/44.

The cross-shaped configuration of the second embodiment (see FIG. 9) has four "arms" 71 extending outward from a generally square or rectangular center portion 70. Each arm 71 has three sides or edges—two generally radial edges 73 and one distal edge 77 generally orthogonal to the radial edges 73—thus providing twelve sides (n=12) to the overall cross-shaped polygon.

Figure 10:
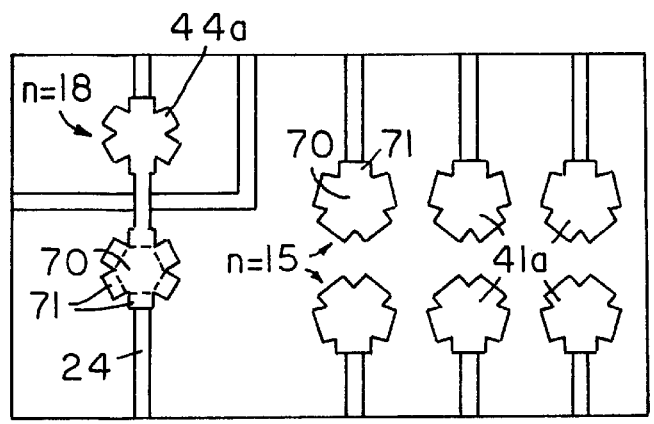
Figure 11:
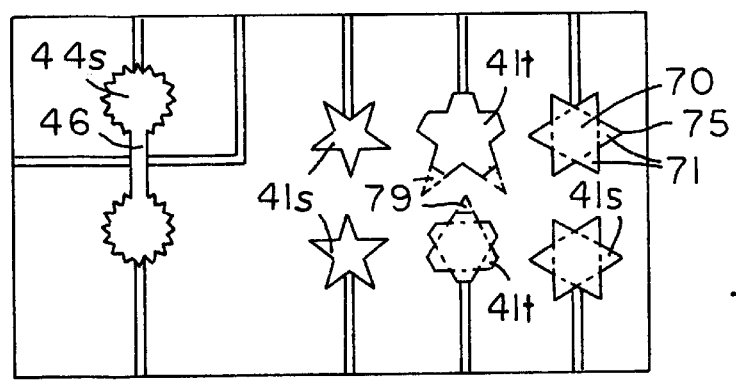
Figure 12:
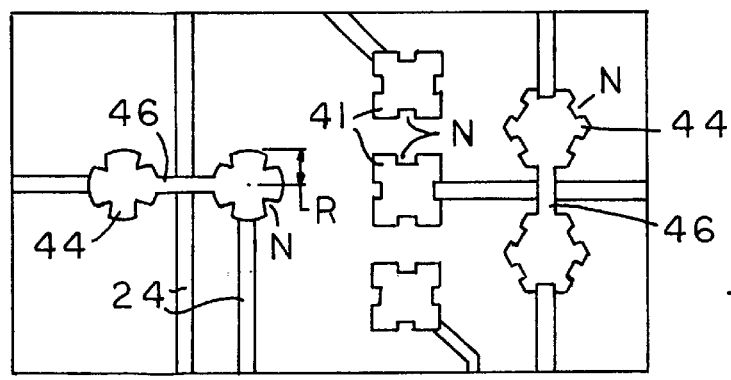
FIG. 12 is a top view of a multilayer air bridge circuit according to a third embodiment of the present invention, wherein each top pad and each enlarged bridge element end has a generally round or polygonal outer periphery with a plurality of notches extending inward from each outer periphery.

The asterisk-shaped configuration 41a/44a is illustrated in FIG. 10. This configuration is similar to the cross-shaped configuration, except that more than four arms 71 are provided.

The star-shaped configuration 41s/44s and the truncated-star-shaped configuration 41t/44t are shown in FIG. 11. These configurations preferably have at least three arms 71 (n=6), with five to eight arms being most preferred. The star-shaped configuration 41s/44s has arms 71 which terminate generally in a point or vertex 75; alternatively, the end 75 of each arm 71 may instead terminate in a rounded fillet or other non-pointed geometry. The truncated-star configuration 41t/44t is similar to the star configuration 41s/44s, except that each arm 71 is generally truncated 77. For example, in FIG. 11 it may be noted that a truncated-star shape has been created by forming a generally star-shaped pattern wherein a distal portion 79 of each arm 71 has been "truncated".

The difference between an asterisk-shaped configuration and the star/truncated configurations is illustrated in FIGS. 10–11, where each configuration has five arms 71, thus providing a generally pentagon-shaped center portion 70. Note that each arm 71 is generally rectangular in the asterisk-shaped configuration, while the arms 71 in the star and truncated configurations are generally triangular and trapezoidal, respectively.

In the third configuration (see FIG. 12), each top pad 41 and/or air bridge end 44 has a generally round or polygonal outer periphery, with a plurality of notches N extending inward from the outer periphery. Each notch N should extend inward somewhere between 5% and 80% of the distance R from the outer periphery to the center of the pad/end; for a circular pad/end R would be the radius of the circle, whereas for a square pad/end R would be one-half the distance between two opposing edges. A preferred range for the notch depth is between 10% and 50% of R, with a most preferred range being 20% to 40% of R.

This same set of ranges for the notch depth may be applied to the second configurations, where the "notch" here would be the gap N between adjacent arms 71. This is illustrated in FIG. 13, where a preferred, eight-armed truncated-star-shaped configuration is illustrated. Here, the overall pad size is 34 mils (i.e., R=17 mils), and the length of each arm 71 and the depth of each "notch" N is 7 mils. (Thus, each notch extends to a depth of 7/17 or approximately 41% of R.)

It should be noted that in all of the foregoing configurations, the arms/notches are preferably arranged generally evenly-spaced circumferentially about each pad/end 41/44.

The first and second conductor patterns 20/40 may be made from the same metal, rather than from two different metals. As alluded to in Belke, Akiyama, and Livshits, a wide variety of metals may be used as the first, second, and third metals, such as aluminum, copper, nickel, steel, and so forth.

Once the precircuit 50 is provided, it may then be attached to a suitable substrate 30. The substrate may be made of metal, polymer, ceramic, and the like, but must have a electrically insulative surface 32 thereon, to which the first conductor pattern 20 is attached. An adhesive may be interposed between the insulative surface 32 and the lower conductor pattern 20, or an adhesive may comprise the insulative surface 32 itself, such as when the substrate 30 is a metal.

After the substrate 30 is attached, the entire precircuit 50 is then subjected to an etchant which etches substantially only the metallic foil/first metal (i.e., not the second/third metals, and thus not the upper/lower conductor patterns 20/40). The etching may be performed by spraying the etchant onto the precircuit, or dipping the precircuit into an etchant bath, or by other known means. After a predetermined amount of exposure time to the etchant, the metallic foil 10 is mostly etched away, except for those portions which are sandwiched either between a top pad 41 and a base pad 26, or between an enlarged air bridge end 44 and a pedestal pad 22. These sandwiched portions of the foil 10 are much less aggressively etched and form the pedestals 48 of each tower element 43 and each air bridge 49. Those pedestals whose top pads 41 or enlarged ends 44 have one of the configurations disclosed herein will be even less aggressively etched, allowing such tower elements and air bridges to be made significantly smaller and/or more densely grouped.

The resulting multilayer electronic circuit 60 will have the same specially configured pads 41 and ends 44 as were present in the precircuit 50 prior to etching of the middle foil 10. The finished circuit 60 will comprise: (1) a substrate 30 having an electrically insulative surface 32; (2) a first conductor pattern 20 attached to the electrically insulative surface 32, wherein the conductor pattern is made of the second metal and comprising a plurality of base pads 26, pedestal pads 22, and circuit traces 24; (3) a plurality of pedestals 48 made of the first metal, wherein a respective one of the plurality of pedestals is disposed atop each base pad 26 and 22 pedestal pad; and (4) a second conductor pattern 40 made of the third metal and comprising (i) a plurality of top pads 41 each attached to a respective one of the pedestals 48 atop a respective one of the base pads 26, and (ii) a plurality of bridging elements 42 having first and second enlarged ends 44 and a constricted portion 46 between and contiguous with the enlarged ends, wherein the bridging elements 42 are arranged such that each enlarged end 44 is disposed atop a respective one of the pedestals 48 atop a respective one of the pedestal pads 22, and wherein each constricted portion 46 is disposed transverse to and spaced apart from a respective one of the circuit traces 24.

Various other modifications to the present invention may occur to those skilled in the art to which the present invention pertains. Other modifications not explicitly mentioned herein are also possible and within the scope of the present invention. It is the following claims, including all equivalents, which define the scope of the present invention.

What is claimed is:

1. A tri-metal-layer precircuit for use in making a multilayer electronic circuit, comprising:
    (a) a metallic foil made of a first metal and having a top surface and a bottom surface;
    (b) a first conductor pattern attached to said bottom surface of said metallic foil and being made of a second metal, wherein said first conductor pattern includes a plurality of base pads, pedestal pads, and circuit traces; and
    (c) a second conductor pattern attached to said top surface of said metallic foil and being made of a third metal, wherein said second conductor pattern includes
        (i) a plurality of top pads each arranged opposite a respective one of said base pads, and
        (ii) a plurality of bridging elements having first and second enlarged ends and a constricted portion between and contiguous with said enlarged ends, wherein said bridging elements are arranged such that each enlarged end is disposed opposite a respective one of said pedestal pads and each constricted portion is disposed opposite and transverse to a respective one of said circuit traces,
    (d) wherein each of said top pads or said enlarged ends is generally shaped as an n-sided polygon, wherein $n \geq 5$.

2. A tri-metal-layer precircuit according to claim 1, further comprising a substrate having an electrically insulative surface, wherein said first conductor pattern is attached to said electrically insulative surface.

3. A tri-metal-layer precircuit according to claim 1, wherein said second and third metals are the same metal.

4. A tri-metal-layer precircuit according to claim 1, wherein said first metal is aluminum and said second and third metals are copper.

5. A tri-metal-layer precircuit according to claim 1, wherein $n \geq 6$ and wherein said n-sided polygon is generally cross-shaped, asterisk-shaped, star-shaped, or truncated-star-shaped.

6. A tri-metal-layer precircuit for use in making a multi-layer electronic circuit, comprising:
  (a) a metallic foil made of a first metal and having a top surface and a bottom surface;
  (b) a first conductor pattern attached to said bottom surface of said metallic foil and being made of a second metal, wherein said first conductor pattern includes a plurality of base pads, pedestal pads, and circuit traces; and
  (c) a second conductor pattern attached to said top surface of said metallic foil and being made of a third metal, wherein said second conductor pattern includes
    (i) a plurality of top pads each arranged opposite a respective one of said base pads, and
    (ii) a plurality of bridging elements having first and second enlarged ends and a constricted portion between and contiguous with said enlarged ends, wherein said bridging elements are arranged such that each enlarged end is disposed opposite a respective one of said pedestal pads and each constricted portion is disposed opposite and transverse to a respective one of said circuit traces,
  (d) wherein each of said top pads or said enlarged ends is generally shaped as an n-sided polygon, wherein n≧6 and wherein said n-sided polygon is generally cross-shaped, asterisk-shaped, star-shaped, or truncated-star-shaped.

7. A tri-metal-layer precircuit according to claim 6, further comprising a substrate having an electrically insulative surface, wherein said first conductor pattern is attached to said electrically insulative surface.

8. A tri-metal-layer precircuit according to claim 6, wherein said second and third metals are the same metal.

9. A tri-metal-layer precircuit according to claim 6, wherein said first metal is aluminum and said second and third metals are copper.

10. A tri-metal-layer precircuit for use in making a multilayer electronic circuit, comprising:
  (a) a metallic foil made of a first metal and having a top surface and a bottom surface;
  (b) a first conductor pattern attached to said bottom surface of said metallic foil and being made of a second metal, wherein said first conductor pattern includes a plurality of base pads, pedestal pads, and circuit traces; and
  (c) a second conductor pattern attached to said top surface of said metallic foil and being made of a third metal, wherein said second conductor pattern includes
    (i) a plurality of top pads each arranged opposite a respective one of said base pads, and
    (ii) a plurality of bridging elements having first and second enlarged ends and a constricted portion between and contiguous with said enlarged ends, wherein said bridging elements are arranged such that each enlarged end is disposed opposite a respective one of said pedestal pads and each constricted portion is disposed opposite and transverse to a respective one of said circuit traces,
  (d) wherein each of said top pads or said enlarged ends has a generally round or polygonal outer periphery thereabout with a plurality of notches extending inward from each outer periphery.

11. A tri-metal-layer precircuit according to claim 10, further comprising a substrate having an electrically insulative surface, wherein said first conductor pattern is attached to said electrically insulative surface.

12. A tri-metal-layer precircuit according to claim 10, wherein said second and third metals are the same metal.

13. A tri-metal-layer precircuit according to claim 10, wherein said first metal is aluminum and said second and third metals are copper.

14. A tri-metal-layer precircuit according to claim 10, wherein said notches extend inward from each outer periphery generally between 10% and 50% of the distance from each outer periphery to a center of each respective pad.

15. A multilayer electronic circuit made of first, second, and third metals, comprising:
  (a) a substrate having an electrically insulative surface;
  (b) a first conductor pattern attached to said electrically insulative surface, said first conductor pattern being made of said second metal and comprising a plurality of base pads, pedestal pads, and circuit traces;
  (c) a plurality of pedestals made of said first metal, wherein a respective one of said plurality of pedestals is disposed atop each base pad and pedestal pad; and
  (d) a second conductor pattern made of said third metal and comprising
    (i) a plurality of top pads each attached to a respective one of said pedestals atop a respective one of said base pads, and
    (ii) a plurality of bridging elements having first and second enlarged ends and a constricted portion between and contiguous with said enlarged ends, wherein said bridging elements are arranged such that each enlarged end is disposed atop a respective one of said pedestals atop a respective one of said pedestal pads, and wherein each constricted portion is disposed transverse to and spaced apart from a respective one of said circuit traces,
  (e) wherein each of said top pads or said enlarged ends is generally shaped as an n-sided polygon, wherein n≧5.

16. A multilayer electronic circuit according to claim 15, herein said second and third metals are the same metal.

17. A multilayer electronic circuit according to claim 15, herein said first metal is aluminum and said second and third metals are copper.

18. A multilayer electronic circuit made of first, second, and third metals, comprising:
  (a) a substrate having an electrically insulative surface;
  (b) a first conductor pattern attached to said electrically insulative surface, said first conductor pattern being made of said second metal and comprising a plurality of base pads, pedestal pads, and circuit traces;
  (c) a plurality of pedestals made of said first metal, wherein a respective one of said plurality of pedestals is disposed atop each base pad and pedestal pad; and
  (d) a second conductor pattern made of said third metal and comprising
    (i) a plurality of top pads each attached to a respective one of said pedestals atop a respective one of said base pads, and
    (ii) a plurality of bridging elements having first and second enlarged ends and a constricted portion between and contiguous with said enlarged ends, wherein said bridging elements are arranged such that each enlarged end is disposed atop a respective one of said pedestals atop a respective one of said pedestal pads, and wherein each constricted portion is disposed transverse to and spaced apart from a respective one of said circuit traces,
  (e) wherein each of said top pads or said enlarged ends is generally shaped as an n-sided polygon, wherein n≧6 and wherein said n-sided polygon is generally cross-shaped, asterisk-shaped, star-shaped, or truncated-star-shaped.

19. A multilayer electronic circuit according to claim 18, wherein said second and third metals are the same metal.

20. A multilayer electronic circuit according to claim 18, wherein said first metal is aluminum and said second and third metals are copper.

21. A multilayer electronic circuit made of first, second, and third metals, comprising:
   (a) a substrate having an electrically insulative surface;
   (b) a first conductor pattern attached to said electrically insulative surface, said first conductor pattern being made of said second metal and comprising a plurality of base pads, pedestal pads, and circuit traces;
   (c) a plurality of pedestals made of said first metal, wherein a respective one of said plurality of pedestals is disposed atop each base pad and pedestal pad; and
   (d) a second conductor pattern made of said third metal and comprising
      (i) a plurality of top pads each attached to a respective one of said pedestals atop a respective one of said base pads, and
      (ii) a plurality of bridging elements having first and second enlarged ends and a constricted portion between and contiguous with said enlarged ends, wherein said bridging elements are arranged such that each enlarged end is disposed atop a respective one of said pedestals atop a respective one of said pedestal pads, and wherein each constricted portion is disposed transverse to and spaced apart from a respective one of said circuit traces,
   (e) wherein each of said top pads or said enlarged ends has a generally round or polygonal outer periphery thereabout with a plurality of notches extending inward from each outer periphery.

22. A multilayer electronic circuit according to claim 21, wherein said second and third metals are the same metal.

23. A multilayer electronic circuit according to claim 21, wherein said first metal is aluminum and said second and third metals are copper.

* * * * *